United States Patent
Iyer et al.

(10) Patent No.: US 9,430,442 B2
(45) Date of Patent: *Aug. 30, 2016

(54) SOLVING A GATE-SIZING OPTIMIZATION PROBLEM USING A CONSTRAINTS SOLVER

(71) Applicant: Synopsys, Inc., Mountain View, CA (US)

(72) Inventors: Mahesh A. Iyer, Fremont, CA (US); Amir H. Mottaez, Los Altos, CA (US)

(73) Assignee: SYNOPSYS, INC., Mountain View, CA (US)

(*) Notice: Subject to any disclaimer, the term of this patent is extended or adjusted under 35 U.S.C. 154(b) by 186 days.

This patent is subject to a terminal disclaimer.

(21) Appl. No.: 13/954,857

(22) Filed: Jul. 30, 2013

(65) Prior Publication Data

US 2015/0039664 A1 Feb. 5, 2015

(51) Int. Cl.
G06F 17/00 (2006.01)
G06F 17/11 (2006.01)
G06F 17/50 (2006.01)

(52) U.S. Cl.
CPC .......... *G06F 17/11* (2013.01); *G06F 17/505* (2013.01)

(58) Field of Classification Search
None
See application file for complete search history.

(56) References Cited

U.S. PATENT DOCUMENTS

| | | | |
|---|---|---|---|
| 6,671,859 B1* | 12/2003 | Naylor | G06F 17/5072 716/113 |
| 6,785,875 B2* | 8/2004 | Beerel | G06F 17/505 703/19 |
| 7,076,753 B2* | 7/2006 | Cerny | G06F 17/504 703/16 |
| 7,418,676 B2* | 8/2008 | Karaki | G06F 17/5059 716/103 |
| 7,512,912 B1* | 3/2009 | Iyer | G01R 31/318307 703/13 |
| 7,539,968 B2* | 5/2009 | Charlebois | G06F 17/505 716/104 |
| 8,799,843 B1* | 8/2014 | Mottaez | G06F 17/505 716/114 |
| 8,826,218 B2* | 9/2014 | Mottaez | G06F 17/5081 716/132 |
| 2006/0247930 A1* | 11/2006 | Iyer | G06F 17/505 704/236 |
| 2007/0005533 A1* | 1/2007 | Iyer | G06F 17/504 706/19 |
| 2011/0185333 A1* | 7/2011 | Iyer | G06F 17/505 716/133 |
| 2011/0191738 A1* | 8/2011 | Walker | G06F 17/50 716/119 |
| 2011/0191740 A1* | 8/2011 | Walker | G06F 17/5031 716/132 |

(Continued)

OTHER PUBLICATIONS

Iyer, "Race: A Word-Level ATPG-Based Constraints Solver System for Smart Random Simulation", 2003, IEEE, pp. 299-308.*

(Continued)

*Primary Examiner* — Paulinho E Smith
(74) *Attorney, Agent, or Firm* — Park, Vaughan, Fleming & Dowler LLP; Laxman Sahasrabuddhe

(57) ABSTRACT

A constraints problem can be created based on a gate-sizing optimization problem for a portion of a circuit design. The constraints problem can comprise a set of upper bound constraints that impose an upper bound on one or more variables that are used in the objective function of the gate-sizing optimization problem. The constraints problem can be repeatedly solved using a constraints solver to obtain a solution of the gate-sizing optimization problem. Specifically, prior to each invocation of the constraints solver, the upper bound can be increased or decreased based at least on a result returned by a previous invocation of the constraints solver.

15 Claims, 7 Drawing Sheets

(56) References Cited

U.S. PATENT DOCUMENTS

| | | | |
|---|---|---|---|
| 2011/0302546 A1* | 12/2011 | Mottaez | G06F 17/5045 716/132 |
| 2012/0030641 A1* | 2/2012 | Mottaez | G06F 17/5045 716/132 |
| 2012/0030642 A1* | 2/2012 | Mottaez | G06F 17/5045 716/134 |
| 2013/0145336 A1* | 6/2013 | Iyer | G06F 17/505 716/134 |
| 2013/0145337 A1* | 6/2013 | Iyer | G06F 17/5031 716/134 |
| 2013/0217359 A1* | 8/2013 | Cherian | G06F 15/177 455/411 |
| 2013/0326449 A1* | 12/2013 | Iyer | G06F 17/5031 716/114 |
| 2014/0033162 A1* | 1/2014 | Iyer | G06F 17/5036 716/135 |
| 2014/0033163 A1* | 1/2014 | Mottaez | G06F 17/50 716/135 |
| 2014/0040851 A1* | 2/2014 | Mottaez | G06F 17/505 716/134 |
| 2015/0039664 A1* | 2/2015 | Iyer | G06F 17/505 708/446 |
| 2015/0040089 A1* | 2/2015 | Iyer | G06F 17/505 716/113 |
| 2015/0040090 A1* | 2/2015 | Mottaez | G06F 17/505 716/113 |
| 2015/0040093 A1* | 2/2015 | Iyer | G06F 17/505 716/133 |
| 2015/0040107 A1* | 2/2015 | Iyer | G06F 11/22 717/131 |

OTHER PUBLICATIONS

Sasao, "Logic Synthesis and Optimization", 1993, p. 341-359.*

* cited by examiner

SOLVING A GATE-SIZING OPTIMIZATION PROBLEM USING A CONSTRAINTS SOLVER

TECHNICAL FIELD

This disclosure relates to solving gate-sizing optimization problems. More specifically, this disclosure relates to solving gate-sizing optimization problems using a constraints solver.

BACKGROUND

Related Art

Many important problems across a wide range of technical fields can be solved by modeling the problems as optimization problems. Therefore, systems and techniques that can accurately and efficiently solve optimization problems are very valuable.

Specifically, many important problems in Electronic Design Automation (EDA) can be modeled as optimization problems. For example, consider circuit synthesis. The goal of circuit synthesis is to convert a high-level description of a circuit design into an implementation that meets a set of timing constraints, and at the same time optionally optimizes one or more metrics, such as area, leakage power, etc.

Some circuit synthesis approaches create an initial circuit design at a given abstraction level (e.g., a logical or physical design). Next, a cell is identified in the circuit design for optimization based on the metrics that are desired to be optimized. An optimal size for the identified cell is then determined by iteratively replacing the identified cell with functionally equivalent cells that have different sizes (this optimization process is also referred to as "sizing the cell," "sizing the gate," etc.). For each replacement cell size that is tried, the circuit synthesis approach updates timing information, and rejects cell sizes for which one or more timing constraints are violated. The iterative optimization process typically terminates after the optimization process has executed for a certain number of iterations or for a certain amount of time. One aspect that further makes this process computationally expensive is that modern technology libraries have many sizes associated with each gate type with varying driving capability and/or multiple threshold voltages.

Unfortunately, such iterative trial-and-error based circuit synthesis approaches either take too long to complete and/or produce poor quality results for large circuit designs in which timing constraints are checked across many process corners and modes.

A circuit synthesis approach that is different from iterative trial-and-error approaches is described in Ivan Sutherland, Robert F. Sproull, and David Harris, *Logical Effort: Designing Fast CMOS Circuits*, Morgan Kaufmann, 1999 (hereinafter "Sutherland"). The cell delay can be represented using the following expression:

$$d = R \cdot C_O + p, \quad (1)$$

where, R is the output resistance of the cell, $C_O$ is the output loading, and p is the parasitic delay of the cell. Equation (1) can then be rewritten as:

$$d = (R \cdot C_i) \cdot \left(\frac{C_o}{C_i}\right) + p, \quad (2)$$

where, $C_i$ is the input capacitance presented by the cell at one of its input terminals.

The circuit synthesis approach described in Sutherland uses the following linear cell delay model:

$$d = g \cdot h + p, \quad (3)$$

where, g represents the logical effort, h represents the electrical effort, and p represents the parasitic delay of the cell. The logical effort captures the effect of the cell's topology on its ability to produce output current. The logical effort is independent of the size of the transistors in the circuit. The electrical effort describes how the electrical environment of the cell affects performance, and how the size of the transistors in the cell determines its load-driving capability. The parasitic delay is a form of delay overhead that accompanies any gate. The logical effort g and the parasitic delay p can be normalized, e.g., they can be normalized with respect to the logical effort and parasitic delay values, respectively, of a reference inverter.

Comparing Equations (2) and (3) we note that the first term $(R \cdot C_i)$ represents the logical effort g, and the second term $$\left(\frac{C_o}{C_i}\right)$$

represents the electrical effort h. Systems and techniques that can optimize a circuit design using such circuit synthesis approaches would be very valuable.

SUMMARY

Some embodiments described herein provide techniques and systems for solving a gate-sizing optimization problem using a constraints solver. Circuit optimization can use different types of optimization "tricks" to improve one or more metrics of the circuit design. The gate-sizing optimization problem specifically refers to the process of optimizing gate sizes (which is one specific type of optimization "trick") to improve one or more metrics of the circuit design. In some embodiments, the constraints solver is a word-level constraints solver, such as an Automatic Test Pattern Generation (ATPG)-based word-level constraints solver. For example, an ATPG-based word-level constraints solver is described in Iyer, M. A., "Method and Apparatus for Solving Constraints for Word-Level Networks," U.S. Pat. No. 7,512,912, which is herein incorporated by reference in its entirety.

Some embodiments can create a constraints problem based on a gate-sizing optimization problem for a portion of a circuit design. Specifically, the constraints problem can comprise: (1) a constraint for each equation in the gate-sizing optimization problem, (2) a set of upper bound constraints that impose an upper bound on one or more variables that are used in the objective function of the gate-sizing optimization problem, and (3) a task definition that computes the value of the objective function of the gate-sizing optimization problem. In addition, the constraints problem can optionally include constraints that impose upper and/or lower bounds on capacitance variables based on estimated capacitance values and/or based on maximum and minimum capacitance values of gates in a technology library and/or a directive to solve for capacitance variables before solving for delay variables. In some embodiments the terms in the set of constraints can be multiplied by normalization factors. Next, the embodiments can solve the gate-sizing optimization problem by repeatedly solving the constraints problem using a constraints solver. Specifically, prior to each invocation of the constraints solver, the upper bound can be increased or decreased based at least on a result returned by a previous invocation of the constraint solver.

In some embodiments, the upper bound can be increased or decreased as follows. Responsive to the constraints solver returning a solution, the upper bound can be decreased prior to the next invocation of the constraints solver. On the other hand, responsive to the constraints solver indicating that no solutions exist or that the constraints solver timed out, the upper bound can be increased prior to the next invocation of the constraints solver. In some embodiments, the upper bound can be increased or decreased within a range of values defined by a lower limit and an upper limit, wherein the lower limit can be increased when the constraints solver indicates that the set of constraints does not have a solution or the constraints solver times out, and wherein the upper limit can be decreased when the constraints solver returns a solution to the set of constraints.

DETAILED DESCRIPTION

Figure 1:
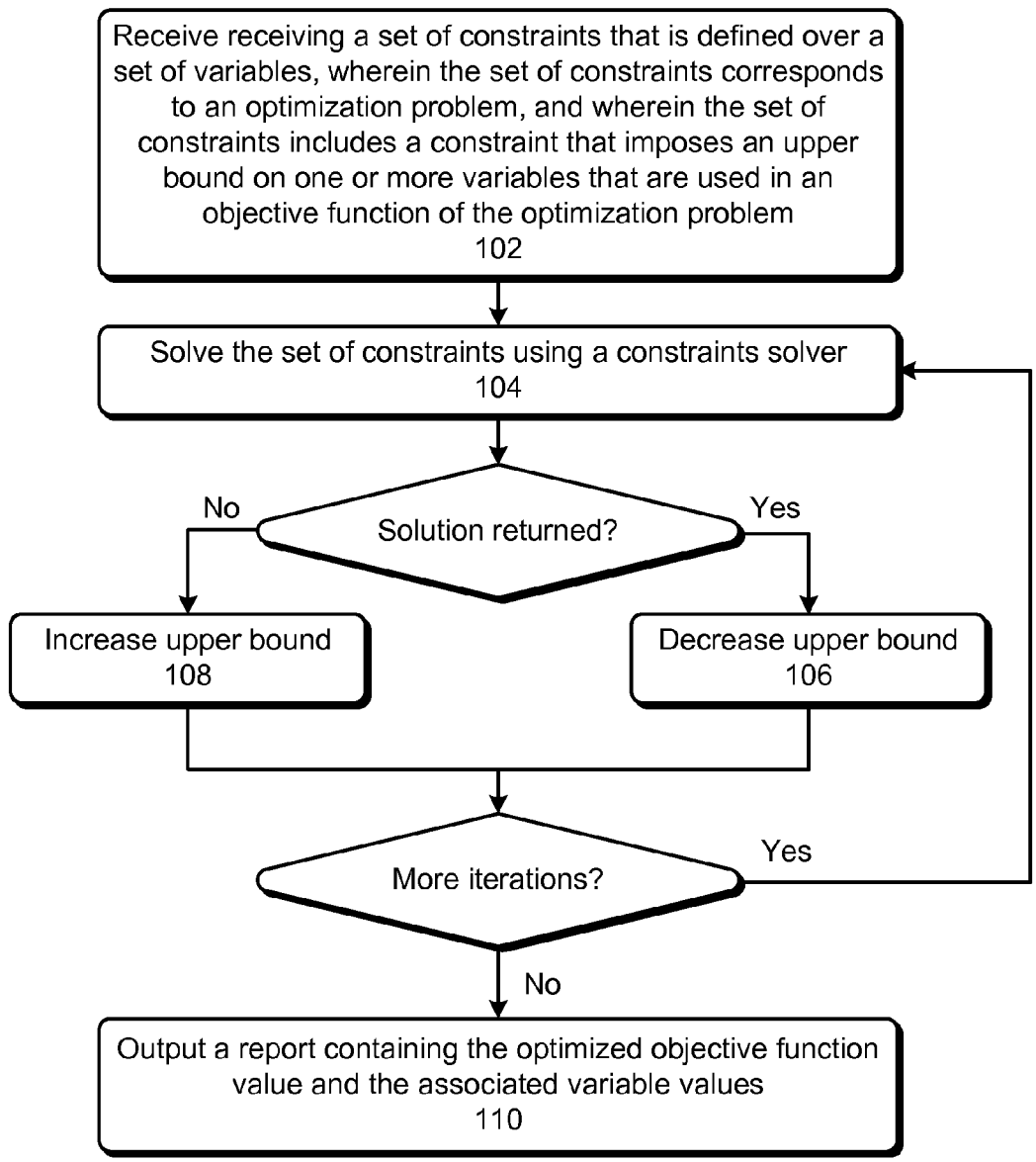
FIG. 1 illustrates a process for using a constraints solver to solve an optimization problem in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when the term "and/or" is used with a list of entities, it refers to all possible combinations of the list of entities. For example, the phrase "X, Y, and/or Z" covers the following cases: (1) only X; (2) only Y; (3) only Z; (4) X and Y; (5) X and Z; (6) Y and Z; and (7) X, Y, and Z.

In the following sections we first provide an overview of constraints solvers and then describe some embodiments that use a constraints solver to solve any general optimization problem, and in particular the gate-sizing optimization problem in EDA.

Constraints Solvers

Functional verification of complex designs largely relies on the use of simulation in conjunction with high-level verification languages (HVL) and test-bench automation (TBA) tools. In a constraints-based verification methodology, constraints are used to model the environmental restrictions (e.g., restrictions on input stimulus values, etc.) of the Design Under Verification (DUV), and the environmental restrictions are specified using HVL constructs. The job of a constraints solver is to produce multiple random solutions that satisfy these constraints. These random solutions are used to drive legal random stimuli to the DUV using procedural HVL constructs.

Most commercial and industry-standard HVL provide means to specify constraints on certain variables (that are declared within the test-bench) and the ability to randomize a certain set of variables upon demand. The constraints typically consist of arbitrary expressions on signed or unsigned variables with varying bit-widths using a wide variety of high-level operators that the HVL supports. The results of this randomization are eventually translated (through procedural code within the test-bench) as legal random stimuli to the DUV. When control is handed over to the simulator, the generated input stimuli is simulated until there are no more events for the simulator in the current clock cycle. At this point, the control is handed back to the test-bench, which asserts on certain properties being true (based on the current signal values of the DUV) and measures its view of functional coverage (as defined in the test-bench). It then generates the next set of random stimuli to the DUV and the process continues, until the test-bench decides to stop.

In order for this verification methodology to reveal corner-case bugs, the random stimuli to the DUV need to have good distributions. Consequently, most HVL also provide means to specify desired distributions on random variables. This functional verification methodology is most commonly used for system-level verification. (Formal and semi-formal verification techniques are more popular at the block-level.)

Smart constrained-random simulation has been identified as a key solution to meet functional verification challenges. The TBA tool therefore needs an efficient constraints solver system with the following features: (1) ability to deal with large number of complex intertwined constraints (modern designs tend to be fairly complex with complex input environmental restrictions), (2) ability to deal with a variety of high-level operators, (3) ability to produce good random distributions, (4) ability to deal with wide bit-widths (verification engineers commonly use wide bit-widths in their test-bench code because the test-bench typically tends to model and verify very high-level behaviors of the DUV, and because using wide bit-widths can be convenient for coding, e.g., a particular variable in a constraint may only need to be 4 bits wide, but for coding convenience, an engineer may decide to represent the variable as a 32-bit integer), (5) seamless solution for signed and unsigned semantics that matches RTL (Register-Transfer Level) semantics, and (6) high performance with high capacity.

A constraints solver that satisfies the above-identified requirements is described in Iyer, M. A., "Method and Apparatus for Solving Constraints for Word-Level Networks," U.S. Pat. No. 7,512,912, which is herein incorporated by reference in its entirety. This constraints solver is an ATPG-based combinational constraints solver that builds a high-level netlist model to represent the constraints and implements a branch-and-bound process to solve the constraints. The solver compactly represents values on variables with large bit-widths and uses advanced interval arithmetic concepts and techniques to propagate values across a wide variety of high-level operators in the netlist. Several deterministic heuristics can be used to guide the search-space exploration in a constraints solver, while maintaining the ability to generate random solutions with good distributions. Some deterministic heuristics are described in (1) Iyer, M. A., "Method and Apparatus for Case-Based Learning", U.S. Pat. No. 7,236,965, (2) Iyer, M. A., "Method and Apparatus for Solving Bit-Slice Operators", U.S. Pat. No. 7,243,087, (3) Iyer, M. A., "Method and Apparatus for Improving Efficiency of Constraint Solving", U.S. Pat. No. 7,302,417, and (4) Iyer, M. A. and Saxena, V., "Method and Apparatus for Improving Efficiency of Constraint Solving", U.S. Pat. No. 7,353,216, which are all herein incorporated by reference in their entirety. The ability to generate multiple random solutions with good distributions for the same constraint problem is a key requirement in constrained random simulation, and is also a key feature that differentiates the constraints solver described in U.S. Pat. No. 7,512,912 from other constraints solvers, such as boolean satisfiability (SAT) solvers and gate-level ATPG tools.

There are numerous techniques to perform bit-level SAT solving. An important difference between conventional bit-level SAT-based solvers and the constraints solvers described in U.S. Pat. No. 7,512,912 is that traditional bit-level SAT-based solvers are not geared towards finding multiple solutions to the same SAT problem, let alone finding solutions that have good distribution over the solution-space. Traditional bit-level SAT-based solvers typically only try to answer the question whether the problem is satisfiable (with an appropriate variable assignment) or not.

Constraints Solver Problem Formulation

The combinational constraints solving problem can be described as follows. Consider a set of variables, $V=\{v_1, v_2, \ldots, v_n\}$, and a set of relations or constraints, $C=\{c_1, c_2, \ldots, c_m\}$, such that each constraint is a relation defined between expressions over a subset of the variables in V. The variables in V have defined bit-widths and sign, which dictate range of values that could possibly be assigned to them. Every variable in V can either be a random variable or a state variable. The constraints solving problem comprises finding legal assignments to all random variables in V for particular values of state variables in V, such that all of the constraints in C are satisfied.

To take a specific example, consider the following constraints problem:

```
class foo {
    rand bit[3:0] a, b;
    rand integer c;
    constraint c1 {
        a + b == c * 2;
    }
    constraint c2 {
        c > 0;
    }
}
```

In the above example, a and b are 4-bit unsigned random variables and c is a 32-bit signed random variable. Thus, a, b, and c can possibly take 16, 16 and $2^{32}$ values respectively. Constraints c1 and c2 represent constraints over variables a, b, and c. The constraints solving problem comprises finding legal values for a, b, and c, that satisfy c1 and c2. One such solution is a=1, b=3, c=2.

A constraint can be defined using any expression of variables specified in a constraints language, e.g., Vera/SystemVerilog. In general, there is no limit to the number of variables that are specified as random/state or the number of constraints specified within a constraints block, or the number of constraint blocks. It is worth noting that constraints could be specified in a conflicting manner, i.e., the set of constraints doesn't have any solution. Typically, this represents a worst-case exhaustive search for the constraints solver because all possible ways to satisfy the constraints lead to conflicts. Some constraints solvers may have heuristics that prune the search-space and guide the solver to such an outcome, i.e., the heuristics can enable the constraints solver to quickly detect that the set of constraints have one or more conflicts. Some constraints solvers may try to identify the minimal set of constraints that make the problem hard or unsolvable for the solver, and provide this information as feedback to the user, so that the user can adjust the constraints to make the problem tractable. In some cases, constraints can be rewritten to make it easier for the solver to find random solutions. In any case, it is important to note that, even if there are no conflicting constraints, the constraints solver may time out if the constraints solver is unable to find a solution within a predetermined amount of time.

Priority Order of Solving Variables

A constraints language (e.g., Vera/SystemVerilog language) may support a construct to specify priority variable ordering for the solver. For example, consider random variables, a, b, c, d, e, $f$, g. The directive "solve a, b, c before d, e, f, g;" can be used to instruct the solver to solve for variables a, b, c before solving for variables d, e, $f$, g. In many situations such directives are provided because assigning values to a, b, c can usually lead to value implications on the other variables d, e, $f$, g, either as a single value assignment or as a restricted range of value assignments (which in general prunes the search-space for the solver).

Using a Constraints Solver to Solve Optimization Problems

A constraints solver can be used to find multiple solutions to a constraints problem (assuming that one or more solutions exist). Note that, in stark contrast to numerical optimization problems, there is no notion of an objective function in a constraints problem. That is, there is no notion of finding the best solution to the constraints given an objective function for an optimization problem. A solution to a constraints problem is merely a variable assignment that satisfies the set of constraints. Embodiments described herein provide systems and techniques to use a constraints solver to solve non-linear optimization problems, such as the gate-sizing optimization problem. Note that it is non-obvious to use a constraints solver (in which there is no notion of an objective function) to solve a non-linear optimization problem (in which the notion of an objective function is very important).

Some optimization approaches use a conjugate-gradient numerical solver to optimize the objective function. These techniques require the objective function to be differentiable. An important difference between such conjugate-gradient based techniques and the constraints solver based techniques that are described herein is that the constraints solver based techniques do not require the objective function to be differentiable and they can provide discrete solutions based on discrete constraints.

In the following examples, we use Vera/SystemVerilog constraints language to describe some embodiments. However, it will be apparent to a person having ordinary skill in the art that the techniques and systems described in this disclosure are generally applicable to any constraints definition language and are not restricted to the Vera/SystemVerilog family of languages.

Some embodiments described herein include two components: a master control component that creates and manages constraint objects and performs optimization search, and core constraints for solving a particular iteration of the optimization problem.

Some embodiments model the optimization problem as an intelligent iterative constraints solver problem. Every invocation of the constraints solver guides the constraints solver to a lower value of the objective cost function. The master control component reacts to the constraints solver's behavior to adjust the objective cost function for the subsequent iteration. Assuming the constraints solver does not time out during its search process, these embodiments guarantee to find the global optimum for the objective function being modeled.

Embodiments described herein can be used with any optimization problem that can be modeled using discrete constraints that are described in a constraints definition language such as the Vera/SystemVerilog constraints language. In some embodiments, the core constraints can have the following requirements/properties (note that these requirements/properties are independent of the type of optimization problem being solved).

The core constraints should include two state variables: a first state variable to keep track of the current cost (hereinafter referred to as "cost") and a second state variable to store the initial cost (hereinafter referred to as "initialCost"). In some embodiments, these state variables can be initialized and manipulated by the master control component.

The core constraints should include one or more variables that model the cost (e.g., the value of a component in the objective function that is to be minimized). Without loss of generality, let "d" be a variable that models the cost in the core constraints specification. Then, the following constraint needs to be included in the core constraints:

d≤cost;

In general, there may be multiple variables that model the cost in the core constraints specification. Depending on the optimization problem, the overall cost in such situations could either be the summation of all the cost variables values or the maximum of all the cost variable values. Embodiments described herein are independent of how the overall cost is computed from the individual cost variables.

A new task should be included in the constraint object for computing the new cost value, e.g., the task named "computeNewCost( )" in the illustrative example shown below. This task encapsulates the optimization problem's notion of "cost" and does all the necessary computation with the solved "d" values to determine the current "cost." The master control component invokes this task to compute the "cost" value during every iteration of the constraints solver invocation, and to determine what the next target cost should be.

State variables need to be introduced to store best cost values and values of key optimization variables that produce those best cost values. Specifically, some embodiments include a new task in the constraint object, e.g., the task named "saveFlowasBest( )" in the illustrative example shown below. This task can be invoked by the master control component to save the best cost values and values of the key optimization variables (that are being solved for). When the iterative optimization loop ends, these best cost values and associated values of optimization variables can be returned to the client.

FIG. 1 illustrates a process for using a constraints solver to solve an optimization problem in accordance with some embodiments described herein. The process can begin by receiving a set of constraints that is defined over a set of variables, wherein the set of constraints corresponds to an optimization problem, and wherein the set of constraints includes a constraint that imposes an upper bound on one or more variables that are used in an objective function of the optimization problem (operation 102). The term "upper bound" in the description of FIG. 1 corresponds to the variable "cost" in the expression "d≤cost;" shown above.

In some embodiments, the optimization problem can be a gate-sizing optimization problem, and the constraints solver can be an ATPG-based word-level constraints solver. In some embodiments the upper bound can be state variable. In other embodiments, the upper bound can be a "constant" (e.g., a numerical value such as "4.3" in the constraints which can be changed between two invocations of the constraints solver) in the constraints.

Next, the process can iteratively perform the following operations on a computer. The set of constraints can be solved using the constraints solver (operation 104). If the constraints solver returns a solution (the "Yes" branch), then the upper bound can be decreased (operation 106). On the other hand, if the constraints solver indicates that no solutions exist or if the constraints solver timed out (the "No" branch), then the upper bound can be increased (operation 108).

In some embodiments, the process can maintain a range of values defined by an upper limit and a lower limit. In each iteration, the upper bound can be increased or decreased within this range of values. Specifically, in each iteration, the lower limit can be increased when the constraints solver indicates that the set of constraints does not have a solution or the constraints solver times out, and the upper limit can be decreased when the constraints solver returns a solution to the set of constraints. Since the range of values progressively becomes narrower (except in some corner cases where the range may widen), the process eventually will converge on an upper bound value, wherein the solution corresponding to this upper bound value produces the optimal objective function.

An embodiment is described below that provides a specific example of how the upper limit, lower limit, and upper bound can be updated during an iterative optimization process. In some embodiments, after the upper limit and the lower limit are updated in a given iteration, the upper bound value for the next iteration can be set to be equal to the midpoint of the range defined by the upper and lower limits. Note that, in these embodiments, the upper bound value that corresponds to the optimal objective function value is essentially being determined using a binary search approach. Such a binary search based approach is just one of many search techniques that can be used to determine the upper bound value that corresponds to the optimal objective function value.

Continuing with the discussion of FIG. 1, the process can then determine if more iterations are required. If so (the "Yes" branch), the process can return to operation 104 and provide the set of constraints with the new upper bound value to the constraints solver. Otherwise (the "No" branch), the process can terminate the iterative loop and output a report of the optimized objective function value and the associated variable values (operation 110).

An Illustrative Example

An example of a constraint class that includes the core constraints and the new tasks is illustrated below:

```
class foo {
    rand bit[15:0] a, b, c, d0, d1, d2;
    bit [15:0] cost;
    bit [15:0] initialCost;
    bit [15:0] best_d0, best_d1, best_d2;
    bit [15:0] best_a, best_b, best_c;
    constraint c1 {
        a + b == c * 2;
        d0 <= cost;
        d0 == (a - 2);
        d1 <= cost;
        d1 == (b - 1);
        d2 <= cost;
        if (a >= b) {
            d2 == (a - b);
        }
        else {
            d2 == (b - a);
        }
        solve a, b before c;
    }
    task computeNewCost( ) {
        cost = d0;
        if (d1 >= cost) {
            cost = d1;
        }
        if (d2 >= cost) {
            cost = d2;
        }
        if (d3 >= cost) {
            cost = d3;
        }
    }
    task saveFlowAsBest( ) {
        best_a = a;
        best_b = b;
        best_c = c;
        best_d0 = d0;
        best_d1 = d1;
        best_d2 = d2;
    }
}
```

In the above definition of the class "foo", a method called "randomize( )" has not been shown for the sake of clarity and ease of discourse. The method "randomize( )" invokes the constraints solver (such as the constraints solver described in U.S. Pat. No. 7,512,912) with the set of constraints defined in constraint "c1." Once an optimization problem is modeled as a constraints problem as described above, an embodiment of the master control component can instantiate an object of the constraint class and call the constraint solver on that object for a large number of times. Then the embodiment could simply pick the random solution from the constraints solver that produced the best cost. A drawback of this approach is that the optimization search is not directed. That is, the constraints solver simply finds random values for the optimization variables, regardless of where it is in the solution search-space of the optimization problem. More importantly, there is no guarantee that the solution produced is in any optimum (local or global).

Some embodiments that are based on directed optimization using a constraints solver are now described. These embodiments can incrementally constrain the solver with a tighter "cost" constraint (during each subsequent iteration), using the previous results of the solver. If the solver fails with the tighter "cost" constraint, then the solver is constrained with a "cost" constraint that is looser than the previous tight constraint, but tighter than the "cost" constraint in the most recent successful solve. Any search technique can be used to converge on the optimal solution. Specifically, in some embodiments, a binary search can be used for updating the value of the "cost" variable. A directed search process guarantees that the cost descends with each successful solve. The process continues until no further tightening of the "cost" constraint is possible, or a max iteration limit is reached.

Some embodiments invoke the constraints solver a fixed number of times initially (the variable numRandomizeIterations in the source code shown below determines the number of times the constraints solver is executed), and use the lowest cost returned by the constraints solver over these iterations as the cost to descend the search from. This approach can help with runtime efficiency and can help the constraints solver to converge in fewer iterations. Also, these initial iterations are fast because the constraints solver's problem remains the same, i.e., the values of the state variables are not changed between iterations, and so the solver can reuse a lot of the learning (e.g., solution space exploration) from previous iterations.

An example of the master control component that uses a binary search is illustrated below:

```
program myProg {
    foo bar = new;
    integer status = 0;
    integer success = 0;
    integer i = 0;
    integer prevFailed = 0;
    bit[63:0] minFailedCost = 0;
    bit[63:0] myNewCost = 0;
    integer numRandomizeIterations = 0;
    integer maxIterations = 100;
    integer statusFile;
    bit first_randomize = 1;
    bar.initialCost = -1;
    bar.cost = -1;
    numRandomizeIterations = 10;
    while(1) {
        if ((bar.initialCost == 0) || (i == maxIterations)) {
            break;
        }
        else if ((bar.initialCost == -1) || (i < numRandomizeIterations)) {
            status = bar.randomize( );
        }
        else {
            if (prevFailed) {
                myNewCost = bar.cost + (bar.initialCost - bar.cost)/2;
            }
            else {
                myNewCost = minFailedCost + (bar.initialCost - minFailedCost)/2;
            }
            if ((myNewCost == minFailedCost) ||
                    (myNewCost >= bar.initialCost * 9999/10000))
            {
                break;
            }
            else {
                bar.cost = myNewCost;
            }
            printf("\tRandomizing with cost: %0d:", bar.cost);
```

```
            status = bar.randomize( );
            first_randomize = 0;
        }
        if (status) {
            bar.computeNewCost( );
            printf(" SUCCESS with cost %d ... iteration:
%0d\n", bar.cost, i);
            if ((bar.initialCost == -1) || bar.cost <
bar.initialCost) {
                bar.initialCost = bar.cost;
                bar.saveFlowAsBest( );
            }
            prevFailed = 0;
            success = 1;
            if (bar.cost <= minFailedCost) {
                minFailedCost = 0;
            }
        }
        else {
            if (first_randomize) {
                printf("Failed for unrestricted cost, problem
is not solvable\n");
                break;
            }
            else if (i >= numRandomizeIterations) {
                printf(" FAILED ... iteration: %0d\n", i);
                prevFailed = 1;
                minFailedCost = bar.cost;
            }
        }
        i ++;
    }
    statusFile = fopen("./cs.Status", "w");
    if (success) {
        printf("\nConverged in %0d iterations with final
cost: %0d\n\n", i, bar.initialCost);
        bar.printBestFlow( );
        fprintf(statusFile, "SUCCESS\n");
        bar.saveSolution( );
    }
    else {
        fprintf(statusFile, "FAIL\n");
    }
    fclose(statusFile);
}
```

The operation of the master control component can be summarized as follows. The master control component performs a process that begins by instantiating a new constraint object of a class that describes the optimization constraints. Next, the process initializes variables used during the search. Particularly, the variables bar.initialCost and bar.cost are initialized to very large values. (Note that the value "−1" when represented as an unsigned number is the largest unsigned number that can be represented in that precision.) Next, the process checks if the cost has reached a value of 0 or the maximum iteration limit is reached, and if so, the process terminates the iteration.

We now describe some of the operations that are performed in each iteration. The object "bar" captures the constraints solver and the set of constraints. At the start of the iteration, the constraints solver is invoked (the call to the task bar.randomize( ) invokes the constraints solver) with the loose initial "cost" value. Optionally, a few random iterations may be run to seed the search with the best cost. The number of random iterations that are performed is determined by the value of the numRandomizeIterations variable in the above process.

Next, the process determines a newCost value for the next iteration of the constraints solver. Specifically, in the set of instructions shown above, bar.cost refers to the current failed iteration's cost, bar.initialCost refers to the cost of the most recent successful solve, and minFailedCost refers to the cost of lowest cost tried so far, for which the constraints solver failed.

If the current iteration failed, then the newCost is loosened to be the midpoint of the current failed iteration's cost and the cost of the most recent successful solve. If none of the invocations of the constraints solver have failed so far, then the current failed iteration's cost will be equal to zero. If the current iteration was successful, then the newCost is tightened to be the midpoint of the current iteration's cost and the lowest cost tried so far, for which the constraints solver failed. If the newCost determined is the same (or very close) to the previous minFailedCost or the most recent successful cost, then the search terminates. Otherwise a new iteration is invoked with a call to the constraints solver with the newly-determined cost.

When the constraints solver succeeds, the following book-keeping is performed: (1) the current cost is computed by calling task "bar.computeNewCost( )" (2) the current solution is saved as the best solution by calling task bar..saveFlowAsBest( ) and (3) bar.initialCost is assigned the current value of cost determined by the solver. The process can adjust the minFailedCost when the constraints solver succeeds. This is required because the constraints solver may have timed out for a previous higher cost (which would have been the minFailedCost), but now produced a cost that is much smaller than the required cost for this iteration; a cost that is even smaller than the previous minFailedCost. In this case, we re-adjust the minFailedCost to be 0 (note that this corner case rarely occurs in practice, but needs to be handled for correctness). If the first iteration itself failed (maximally loose cost constraint), then the iteration stops, and the process can optionally identify and report a minimal set of conflicting constraints in the optimization problem (note that this case is very unlikely to occur in non-linear problems that have been correctly modeled). When the iteration terminates, the process can produce an output file with information about whether the constraints solver succeeded, and if so, in how many iterations and the best cost and variable values that were produced.

Note that the terms "upper limit" and "lower limit" that were mentioned in the description of FIG. 1 correspond to the variables bar.initialCost and minFailedCost, respectively. The statement "bar.initialCost=bar.cost;" decreases the value of the variable bar.initialCost when the constraints solver returns a solution. The statement "minFailedCost=bar.cost;" increases the value of the variable minFailedCost when the constraints fails to return a solution (e.g., because the constraints solver timed out or determined that no solution exists). The statements "myNewCost=bar.cost+(bar.initialCost−bar.cost)/2;" and "myNewCost=minFailedCost+(bar.initialCost−minFailedCost)/2;" set the value of the variable myNewCost (which corresponds to the term "upper bound" in the description of FIG. 1) to the midpoint of minFailedCost (which corresponds to the term "lower limit" in the description of FIG. 1) and bar.initialCost (which corresponds to the term "upper limit" in the description of FIG. 1).

The above process described how a constraints solver can be used to solve any generic optimization problem. Next, as an illustrative example, we describe how a constraints solver can be used to solve the gate-sizing optimization problem in EDA. Specifically, in the following sections, we provide an overview for an EDA flow, an overview of numerical synthesis, and a description of the gate-sizing optimization problem. Then, we describe an embodiment that uses a constraints solver to solve the gate-sizing optimization problem.

Overview of an EDA Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are for illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Numerical Synthesis

Figure 2:
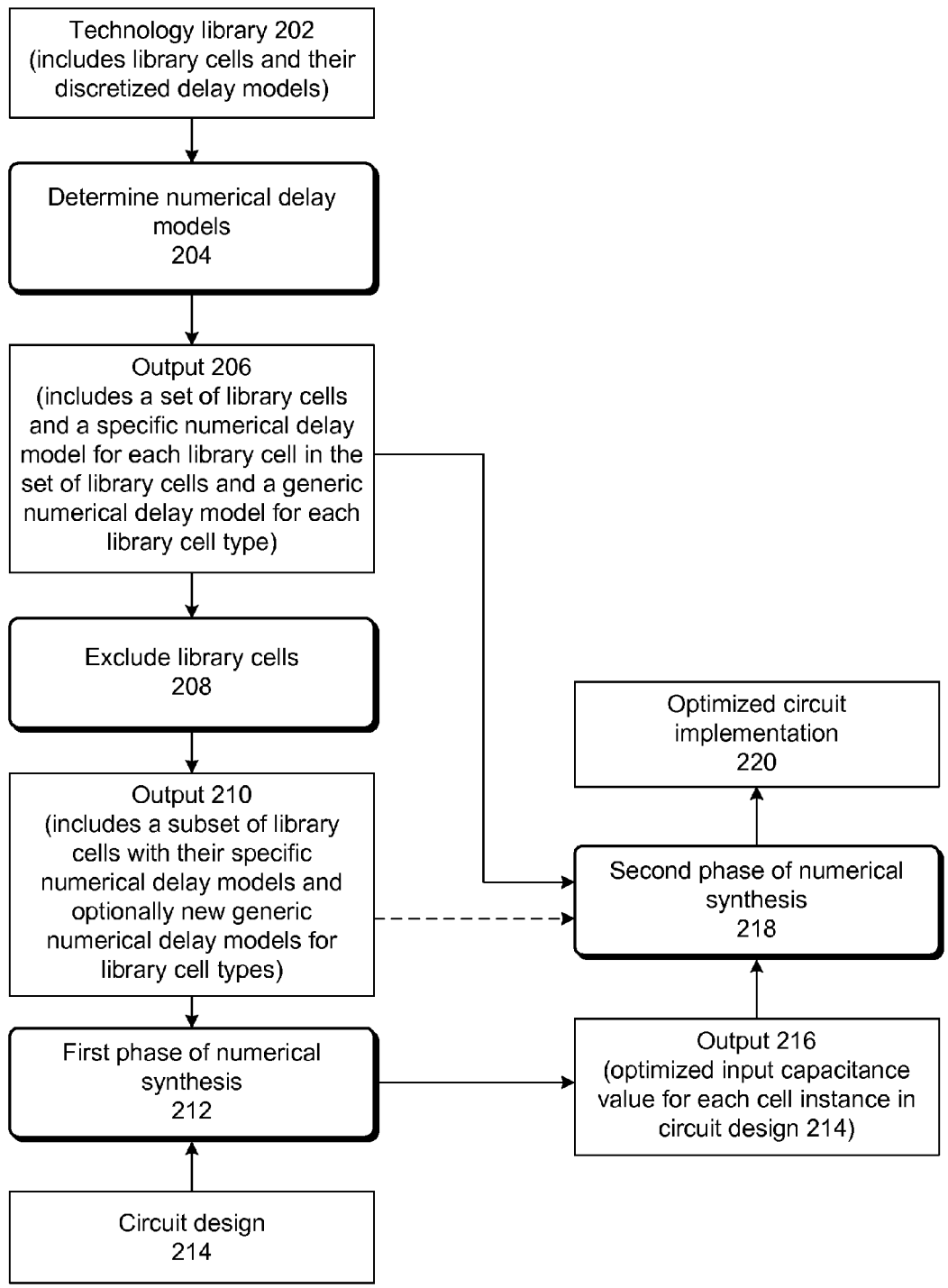
FIG. 2 illustrates a numerical synthesis process in accordance with some embodiments described herein.

FIG. 2 illustrates a numerical synthesis process in accordance with some embodiments described herein.

Technology library 202 includes library cells and discretized non-linear delay models for the library cells. The library cells in the technology library 202 can be used to create and/or optimize a circuit design. The term "library cell" refers to a cell in a technology library. The term "library cell" is to be distinguished from the term "cell instance" which is an instantiation of a library cell in a circuit design. In some embodiments, a discretized delay model models the delay for a timing arc of a library cell. The terms "cell" and "gate" are used interchangeably in this disclosure.

The term "library cell type" refers to a particular logical functionality. Examples of functionalities include, but are not limited to, "AND," "OR," "XOR," "multiplexor," etc. The term "library cell" refers to a particular implementation of a library cell type. A technology library can be viewed as a collection of library cells of one or more library cell types. For example, a technology library may include multiple sizes of an inverter. In this example, the term "inverter" is the library cell type, and the term "library cell" refers to an inverter implementation of a particular size.

A numerical delay model is a delay model that can be used by a numerical solver to optimize a cost function. A linear delay model is one example of a numerical delay model. More generally, an analytical formula that represents the delay behavior is an example of a numerical delay model.

The term "specific numerical delay model" refers to a numerical delay model that models the delay behavior of a particular timing arc of a particular library cell, or the delay behavior of a particular library cell. A specific numerical delay model is defined using a specific logical effort value and a specific parasitic delay value.

The term "generic numerical delay model" refers to a numerical delay model that models an aggregated (over all technology library cells) delay behavior of either a timing arc of a library cell type or the library cell type itself. A generic numerical delay model is defined using a generic logical effort value and a generic parasitic delay value.

Examples of systems and techniques that can be used to determine specific and generic numerical delay models (which can be used to perform operation 204) are described in U.S. patent application Ser. No. 13/450,178, entitled "Numerical delay model for a technology library cell and/or a technology library cell type," the contents of which are herein incorporated by reference in their entirety.

Some embodiments determine numerical delay models based on technology library 202 (operation 204). Output 206 of operation 204 can include a set of library cells and a specific numerical delay model for each library cell in the set of library cells and a generic numerical delay model for each library cell type. The set of library cells in output 206 typically includes all library cells in technology library 202, but in some embodiments certain library cells may be removed if desired.

Certain library cells can then be excluded (operation 208) to obtain a subset of library cells. Each library cell in the subset of library cells has a specific numerical delay model that was computed in operation 204. In some embodiments, a new generic numerical delay model can be determined for each cell type based on the specific numerical delay models corresponding to the subset of library cells. These generic numerical delay models are "new" because they are based on the subset of library cells as opposed to being based on the set of library cells that were used in operation 204 to determine the generic numerical delay models. Output 210, i.e., the subset of library cells with their specific numerical delay models and optionally the new generic numerical delay models for the library cell types, can then be provided as input to the first phase of numerical synthesis 212.

Examples of systems and techniques that can be used to exclude library cells (which can be used to perform operation 208) are described in U.S. patent application Ser. No. 13/479,807, entitled "Excluding library cells for delay optimization in numerical synthesis," the contents of which are herein incorporated by reference in their entirety.

The first phase of numerical synthesis 212 sizes cells in circuit design 214 using the subset of library cells with their specific numerical delay models and the new generic numerical delay models. In some embodiments, the first phase of numerical synthesis 212 models a numerical optimization problem based on circuit design 214 and the specific and generic numerical models for the subset of library cells. Output 216 from the first phase of numerical synthesis 212 includes the numerically optimized size for each cell instance in circuit design 214. Specifically, in some embodiments, output 216 includes the numerically optimized (and desired) input capacitance value for each cell instance in the circuit design 214.

Output 216 is then provided as one of the inputs to the second phase of numerical synthesis 218. The other inputs to second phase of numerical synthesis 218 include the library cells in technology library 202 and output 206 which includes the numerical delay models that were generated by operation 204. The second phase of the numerical synthesis 218 then instantiates cells that have the numerically optimized and desired cell sizes in circuit design 214 to produce optimized circuit implementation 220 using the discrete library cells from the technology library. In particular, for each cell instance in circuit design 214, the second phase of numerical synthesis 218 selects a library cell that best matches the numerically optimized size, (if a library cell with exactly the optimized size is not available, a library cell with nearly the optimized size is selected) from the set of library cells that were part of output 206. In some embodiments, second phase of numerical synthesis 218 also receives output 210 as input (shown in FIG. 2 using a dashed line). Specifically, second phase of numerical synthesis 218 uses the fact that certain cells were excluded from output 206 to determine which cells to instantiate. If the user marks certain library cells as "do not use" cells, then the optimization process does not use them. Note that the first phase of numerical synthesis can include delay or area optimization, and the second phase of numerical synthesis is referred to as discretization.

The reason a subset of library cells is used in the first phase and the set of all library cells is used in the second phase is as follows. The first phase determines numerically optimized cell sizes by solving a numerical optimization problem. In this phase, it is desirable to restrict the search space to library cells that can be accurately modeled using a logical effort and parasitic delay based numerical modeling approach. Therefore, a subset of library cells is used in this phase to restrict the search space. Once the numerically optimized cell sizes have been determined, it is important to enable the circuit synthesis process to select cell instances from a wide range of library cells. Therefore, in the second phase, the restriction on the search space is relaxed and the set of library cells that was in output 206 is used.

In general, gates can be optimized in any arbitrary order. Some embodiments described herein optimize gates in a reverse-levelized order so that, when a current set of gates are being optimized, the loads on those gates can be modeled accurately as fixed loads because those loads would have already been optimized in the current iteration. In a reverse-levelized processing order, each logic gate is associated with a level so that each logic gate's level is greater than the highest level associated with logic gates that are electrically coupled to the logic gate's fan-in. Optimizing gates in reverse-levelized order means that the gates are optimized in decreasing order of their levels, i.e., a gate at level n−1 will only be optimized after all gates at level n have been optimized. Gates at the same level may be optimized in any arbitrary order.

Figure 3:
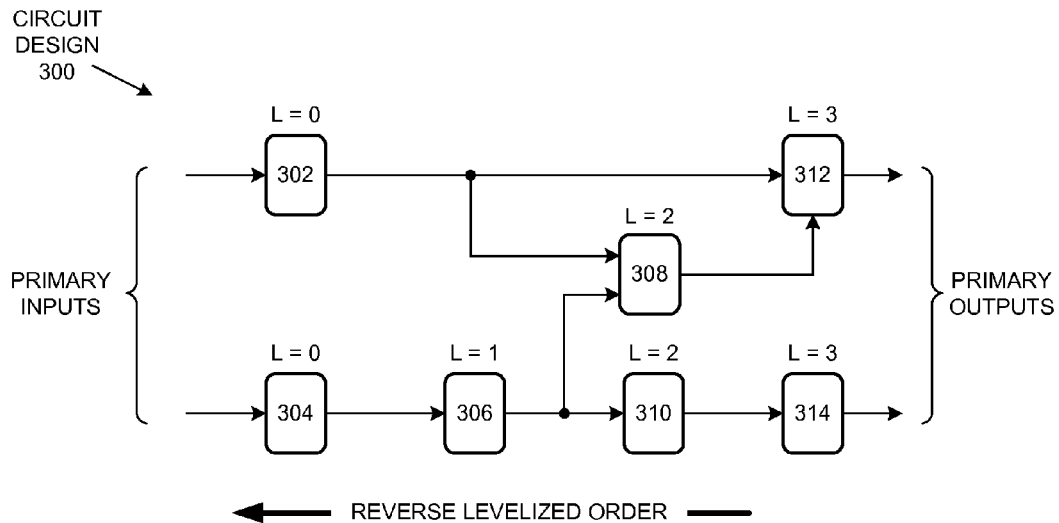
FIG. 3 illustrates a reverse-levelized processing order in accordance with some embodiments described herein.

FIG. 3 illustrates a reverse-levelized processing order in accordance with some embodiments described herein. In the figure, the notation "L=n," where n is a number denotes that the level associated with the logic gate is equal to n. Circuit design 300 includes logic gates 302, 304, 306, 308, 310, 312, and 314 that have been assigned levels 0 through 3. The logic gates shown in FIG. 3 can have any logic functionality, and can have one or more inputs and one or more outputs. Logic gates 302 and 304, whose fan-in is coupled to a primary input of the circuit design, are assigned level 0. All other logic gates are assigned a level that is greater than the highest level associated with the logic gates that are electrically coupled to the logic gate's fan-in. For example, logic gate 306 is assigned level 1, logic gates 308 and 310 are assigned level 2, and logic gates 312 and 314 are assigned level 3. In a reverse-levelized optimization order, the optimization process optimizes logic gates in decreasing order of their levels. For example, some embodiments described herein would optimize logic gates 312 and 314 before optimizing logic gates 308 and 310, and so forth. In some embodiments, the outputs of gates 312 and 314 can be the primary outputs of circuit design 300.

The above description of the reverse-levelized order was provided for illustration purposes only, and is not intended to limit the embodiments described herein to a particular gate optimization order. It will be apparent to a person having ordinary skill in the art that the gates can be optimized in any desired order.

Modeling the Gate-Sizing Optimization Problem

Figure 4A:
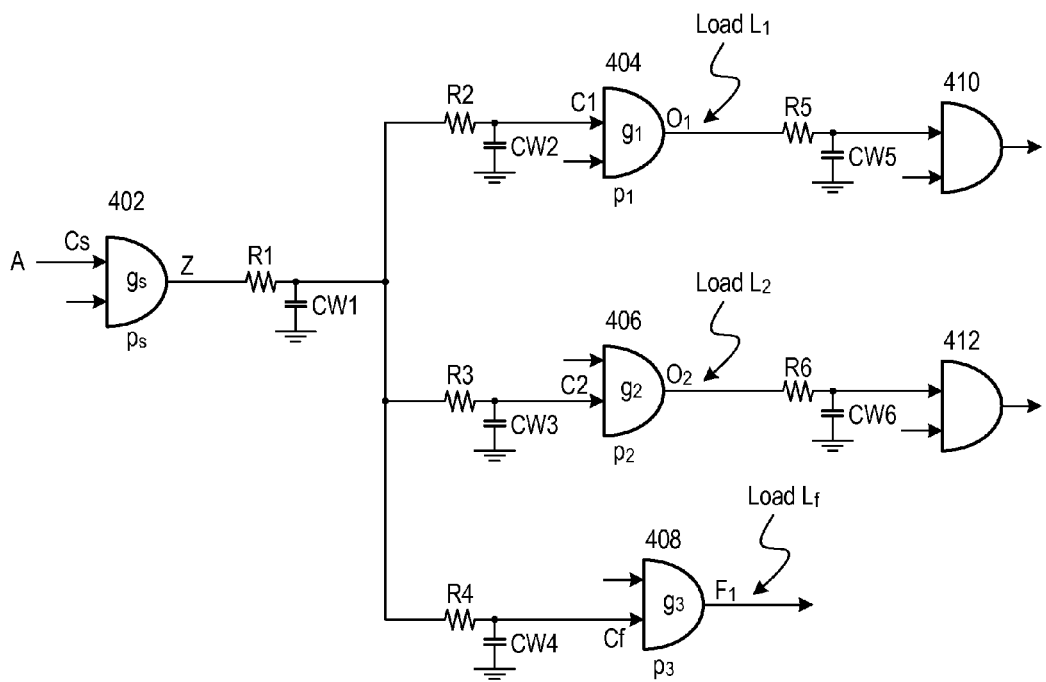
FIG. 4A how a gate-sizing optimization problem can be modeled in accordance with some embodiments described herein.

FIG. 4A how a gate-sizing optimization problem can be modeled in accordance with some embodiments described herein.

The portion of the circuit design shown in FIG. 4A includes gates 402, 404, 406, 408, 410, and 412. The gates shown in FIG. 4A can have any logic functionality, i.e., the gate symbols used in FIG. 4A do not correspond to a particular logic function. Furthermore, although only two inputs and one output is shown per gate in FIG. 4A, these gates can generally have one or more inputs and one or more outputs. The output of driver gate 402 is electrically connected to the inputs of gates 404, 406, and 408. The outputs of gates 404 and 406 are electrically connected to the inputs of gates 410 and 412, respectively. The electrical behavior of the wires that electrically connect outputs and inputs is modeled using a network of resistances and capacitances as shown in FIG. 4A. For example, the electrical behavior of the wire that electrically connects the output of driver gate 402 with the inputs of gates 404, 406, and 408 is modeled using a network of resistances R1-R4 and capacitances CW1-CW4. Likewise the electrical behavior of the wire that electrically connects the output of gate 404 with the input of gate 410 is modeled using resistance R5 and capacitance CW5, and the electrical behavior of the wire that electrically connects the output of gate 406 with the input of gate 412 is modeled using resistance R6 and capacitance CW6.

The input capacitances (i.e., of the inputs shown in FIG. 4A) of gates 402, 404, 406, and 408 are Cs, C1, C2, and Cf, respectively. The labels $O_1$, $O_2$, and $F_1$ correspond to the output pins of gates 404, 406, and 408, respectively. The loads at $O_1$, $O_2$, and $F_1$, are $L_1$, $L_2$, and $L_f$, respectively. The generic logical effort values for gates 404 and 406 are $g_1$ and $g_2$, respectively. The generic parasitic delay values for gates 404 and 406 are $p_1$ and $p_2$, respectively. The specific logical effort and parasitic delay values for gate 402 are $g_s$ and $p_s$, respectively. The specific logical effort and parasitic delay values for gate 408 are $g_3$ and $p_3$, respectively.

Delays from pin A to output pins $O_1$, $O_2$, and $F_1$, are modeled as follows. Let the wire delays from pin Z to pins $O_1$, $O_2$, and $F_1$, be dw1, dw2, and dw3. The wire delays dw1, dw2, and dw3 can be modeled using an Elmore delay model. Systems and techniques for efficiently computing Elmore wire delay are described in U.S. patent application Ser. No. 13/485,600, entitled "Incremental Elmore delay calculation," the contents of which are herein incorporated by reference in their entirety. Specifically, let CWT=CW1+CW2+CW3+CW4. Delay dw1 can be modeled as dw1=τ1+B11·C1+B12·C2, where, $$\tau 1 = R1 \cdot (CWT + Cf) + R2 \cdot CW2,$$

$$B11 = (R1 + R2), \text{ and}$$

$$B12 = R1. \tag{4}$$

Likewise, delays dw2 and dw3 can be modeled as dw2=τ2+B21·C1+B22·C2 and dw3=τ3+B31·C1+B32·C2, respectively, where, $$\tau 2 = R1 \cdot (CWT + Cf) + R3 \cdot CW3,$$

$$B21 = R1,$$

$$B22 = R1 + R3,$$

$$\tau 3 = R1 \cdot (CWT + Cf) + R4 \cdot (CW4 + Cf),$$

$$B31 = R1, \text{and}$$

$$B32 = R2. \tag{5}$$

Let the delays from pin A to output pins $O_1$, $O_2$, and $F_1$ be $f_1$, $f_2$, and $f_3$, respectively. Delay $f_1$ can be expressed as follows:

$$f_1 = \frac{g_s}{C_s} \cdot (CWT + C1 + C2 + Cf) + p_s + dw1 + \frac{g_1}{C1} \cdot L_1 + p_1 \tag{6}$$

$$= \frac{g_s}{C_s} \cdot (CWT + Cf) + \tau 1 + p_s + p_1 + \left(\frac{g_s}{C_s} + B11\right) \cdot C1 +$$

$$\left(\frac{g_s}{C_s} + B12\right) \cdot C2 + \frac{g_1 \cdot L_1}{C1}.$$

Equation (6) can be rewritten as:

$$f_1 = K1 + A11 \cdot C1 + A12 \cdot C2 + \frac{\phi 1}{C1}, \tag{7}$$

where, $$K1 = \frac{g_s}{C_s} \cdot (CWT + Cf) + \tau 1 + p_s + p_1, \tag{8}$$

$$A11 = \frac{g_s}{C_s} + B11,$$

$$A12 = \frac{g_s}{C_s} + B12, \text{ and}$$

$$\phi 1 = g_1 \cdot L_1.$$

Likewise, $f_2$ can be expressed as follows:

$$f_2 = K2 + A21 \cdot C1 + A22 \cdot C2 + \frac{\phi 2}{C2}, \tag{9}$$

where, $$K2 = \frac{g_s}{C_s} \cdot (CWT + Cf) + \tau 2 + p_s + p_2, \tag{10}$$

$$A21 = \frac{g_s}{C_s} + B21,$$

$$A22 = \frac{g_s}{C_s} + B22, \text{ and}$$

$$\phi 2 = g_2 \cdot L_2,$$

and, $f_3$ can be expressed as follows:

$$f_3 = K3 + A31 \cdot C1 + A32 \cdot C2, \tag{11}$$

where, $$K3 = \frac{g_s}{C_s} \cdot (CWT + Cf) + \tau 3 + \frac{g_3 \cdot L_f}{Cf} p_s + p_3, \tag{12}$$

$$A31 = \frac{g_s}{C_s} + B31, \text{ and}$$

$$A32 = \frac{g_s}{C_s} + B32.$$

Different objective functions can be used depending on optimization goal. Specifically, the objective function $f_c$ for the "best delay" optimization goal, which minimizes the maximum delay without any area considerations, can be expressed as follows:

$$f_c = \max(f_1, f_2, f_3), \tag{13}$$

where, "max" is a function that outputs the maximum value from the set of values that are provided as arguments to the function.

Alternatively, the optimization goal can be the "minimum area under delay constraints" goal, which minimizes the area of the circuit design while meeting delay constraints. Let D1, D2, and D3 be the required delays from pin A to pins $O_1$, $O_2$, and $F_1$, respectively. Then, the objective function $f_C$ for the "minimum area under delay constraints" optimization goal can be expressed as follows:

$$f_C = \max[(f_1 - D1), (f_2 - D2), (f_3 - D3)]. \tag{14}$$

The term "($f_3$–D3)" in Equation (14) can limit the solver from arbitrarily increasing C1 and C2. (Note that gate 408 is a fixed gate and is not being optimized simultaneously with gate 404 and gate 406.) Therefore, in some alternate embodiments, the objective function can be formulated without using the "($f_3$–D3)" term. In these embodiments, the capacitance CW4 and the capacitance Cf are still used for computing the delay of the driver gate and for computing wire delays from pins Z to pins $O_1$ and $O_2$.

Figure 4B:
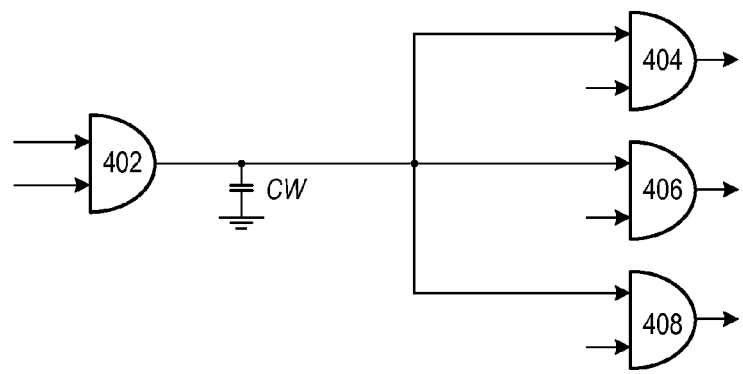
FIGS. 4B-4D illustrate a best case wire load model, a worst case wire load model, and a balanced-tree wire load model, respectively, in accordance with some embodiments described herein.
Figure 4C:
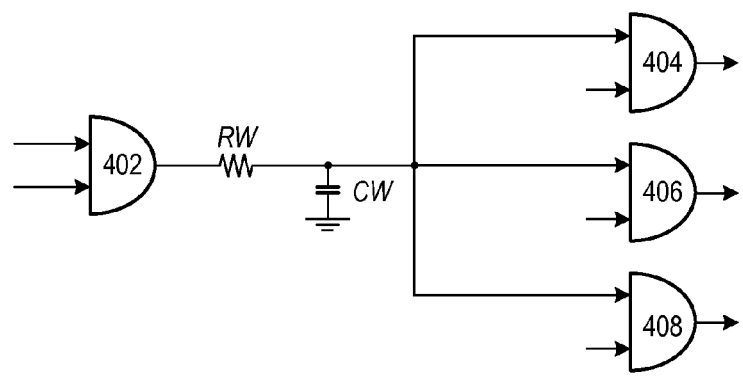
Figure 4D:
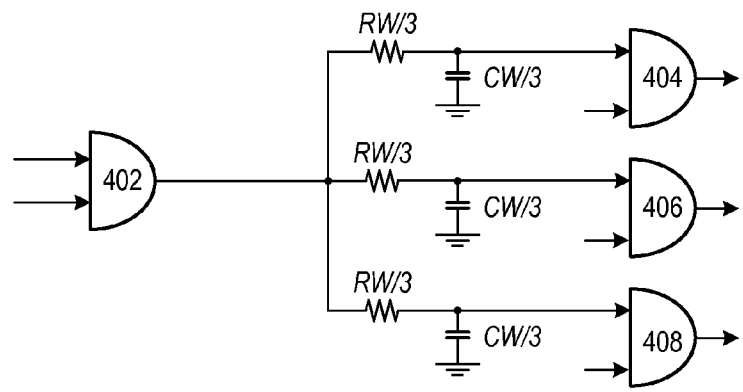

Although some embodiments described herein used the Elmore wire load model, the systems and techniques described in this disclosure can generally use any wire load model. Specifically, the systems and techniques described herein can use a best case wire load model (which is a model that ignores the wire resistance and models the wire load using a single lumped capacitance), a worst case wire load model (which is a model that uses a lumped resistance and a lumped capacitance to model the wire load), and a balanced-tree wire load model (which is a model that distributes the total capacitance and resistance of the wire equally across each branch, and uses a lumped capacitance and lumped resistance to model the wire load of each branch). FIGS. 4B-4D illustrate a best case wire load model, a worst case wire load model, and a balanced-tree wire load model, respectively, in accordance with some embodiments described herein. In FIGS. 4B-4D, RW is the wire resistance and the CW is the wire capacitance.

Process for Optimizing a Circuit Design

Figure 5A:
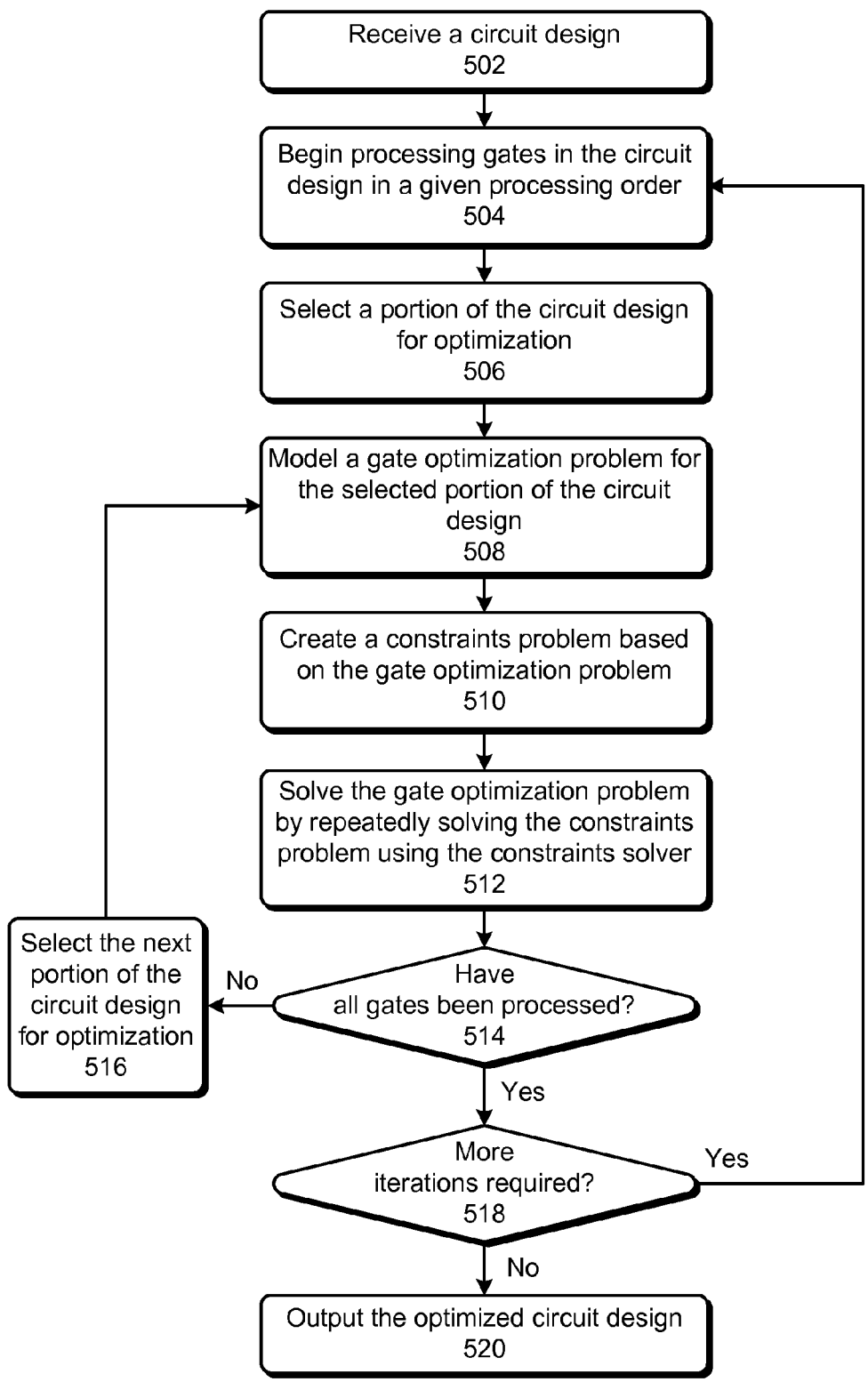
FIG. 5A illustrates a process for optimizing a circuit design in accordance with some embodiments described herein.

FIG. 5 illustrates a process for optimizing a circuit design in accordance with some embodiments described herein. An embodiment (e.g., a computer system) can perform the process, which begins by receiving a circuit design (operation 502). The circuit design can generally be at any abstraction level, e.g., the circuit design can be a logical design or a physical design.

Next, the embodiment begins processing gates in the circuit design in a given processing order (operation 504).

For example, in some embodiments, the embodiment can process the gates in a reverse-levelized processing order as explained in reference to FIG. 3. The embodiment then selects a portion of the circuit design for optimization (operation 506). For example, the embodiment may select the portion of the circuit design shown in FIG. 4A for optimization.

Next, the embodiment can model a gate-sizing optimization problem for the selected portion of the circuit design (operation 508). Modeling the gate-sizing optimization problem can involve collecting (e.g., by retrieving values stored in memory locations) circuit information (e.g., capacitance values, resistance values, logical effort values, electrically connectivity information between different circuit elements, etc.) for the selected portion of the circuit design, and constructing expressions for determining values of entities (e.g., delay values) that are required during optimization.

In some embodiments, the selected portion of the circuit design can include a driver gate that drives one or more inputs of each gate in a set of gates. In these embodiments, the collected circuit information can include generic logical effort values of each gate in the set of gates, an input capacitance value and a specific logical effort value of the driver gate, and wire resistance and capacitance values of a net that electrically connects an output of the driver gate with one or more inputs of each gate in the set of gates. The circuit information can further include a generic logical effort value for a driver gate, and a fixed load value as seen by the driver gate.

The embodiment can then create a constraints problem based on the gate-sizing optimization problem (operation 510). For example, consider the circuit shown in FIG. 4A. Equations (7), (9), (11), and (13) (or Equation (14) in lieu of Equation (13)) capture the gate-sizing optimization problem when Elmore delays are used. Specifically, Equations (7), (9), and (11) express the relationship between the delay values $f_1$, $f_2$, and $f_3$ and the variables that are being optimized, namely, capacitances C1 and C2. Equations (13) and (14) provide two different objective functions that correspond to two different circuit optimization goals (only one of these two objective functions will be used in the gate-sizing optimization problem depending on circuit optimization goal).

The constraints problem can be created based on the gate-sizing optimization problem as follows. Equations (7), (9), and (11) can be provided directly as constraints (if the constraints solver cannot handle floating point variables, then a conversion operation between floating points and integers may be required, which is described below). Additionally, the following upper bound constraints (wherein the variable "cost" corresponds to the term "upper bound" in the description of FIG. 1) can be added to the set of constraints if the objective function shown in Equation (13) is being used: "$f_1 \leq cost$," "$f_2 \leq cost$," and "$f_3 \leq cost$." The values of $f_1, f_2$, and $f_3$ are also bounded to be greater than or equal to 0. On the other hand, if the objective function shown in Equation (14) is being used, then the following upper bound constraints can be added: "$f_1 - D1 \leq cost$," "$f_2 - D2 \leq cost$," and "$f_3 - D3 \leq cost$." The values of ($f_1 - D1$), ($f_2 - D2$), and (f3 − D3) are also bounded below by 0.

The solver's capacitance variables can be restricted to be between a range of values around some estimated capacitance values. For example, capacitance values can be estimated using an approach described in U.S. application Ser. No. 13/537,880, entitled "Estimating optimal gate sizes by using numerical delay models" by inventors Amir H. Mottaez and Mahesh A. Iyer, which is herein incorporated by reference in its entirety. In some embodiments, we can also restrict the capacitance values to the minimum and maximum available capacitance values (for the smallest and biggest size of the gate being sized), if that produces a tighter range.

A directive can be included in the constraints problem that instructs the solver to solve for the capacitance variables before solving for the delay variables. This can improve performance because, for a given set of capacitance variable values, the delay variable values will be auto-determined during the constraints solver's implication process. The task saveFlowAsBest( ) can be added to save the capacitance values that have produced the best cost value thus far in the optimization process. Recall that this task is called by the master control component after each successful solve. The task computeNewCost( ) can be added to compute the new cost based on the objective function shown in Equation (13) or Equation (14) depending on the optimization goal. The task saveSolution( ) can be added to save the best capacitance values to a file. This task can be called by the master control component when the optimization process completes. The saved file communicates the optimal capacitance values for the gates being sized to the (physical) synthesis system (which created these constraints and invoked the constraints solver). Note that the above description was based on Elmore delays. A constraints problem can likewise be created when a wire load model, e.g., see FIGS. 4B-4D, is used.

Note that the variables in Equations (7), (9), (11), (13), and (14) can have floating point values. If the constraints solver cannot handle floating point variables, then the floating point variables in the gate-sizing optimization problem may need to be converted into integer variables (within some precision), and the solution from the constraints solver (which will be an integer value) may need to be converted back into a floating point value.

Specifically, some embodiments can convert the floating point values and variables to a pre-defined precision of integer values and variables by multiplying or dividing the various variables by multiples of 10. For example, if two decimal places after the decimal point are desired to be retained, then a floating point value of "0.156789" would be modeled as "0.156789*100"=16 in the set of constraints. Depending on the precision chosen and the magnitude of the floating point values, the bit-widths of the variables in the set of constraints can be determined, so that there is no loss of precision when the constraints solver solves the constraints problem. For example, if we want a two decimal place precision (i.e., two decimal places after the decimal point are desired to be retained) for capacitance values C1 and C2 in Equation (7), then the following normalization operations will need to be performed when Equation (7) is converted into a constraint: (a) multiply the A11 and A12 values by a normalization factor of 100, (b) multiply the K1 value by a normalization factor of 10,000, and (c) multiply the φ1 value by a normalization factor of 1,000,000. An explanation for these normalization factors is as follows. First, note that the capacitance values C1 and C2 in Equation (7) are multiplied by 100 to achieve the two decimal place precision. Therefore, the A11 and A12 values also need to be multiplied by 100 so that they are consistent with the C1 and C2 values. Note that the terms A11·C1 and A12·C2 are now 10,000 times their original values. Therefore, to ensure that the K1 value is consistent with the terms A11·C1 and A12·C2, we need to multiply the K1 value by 10,000. Note that the value of C1 in the denominator of the term φ1/C1 was multiplied by 100 to achieve the desired two decimal place precision. Therefore, to ensure that the term ϕ1/C1 is consistent with the other terms in Equation (7), we need to multiply the value of ϕ1 by 1,000,000.

The optimized integer capacitance values produced by the constraints solver can then be divided by the normalization factor 100 to obtain the actual floating point capacitance values. Note that, due to this normalization operation, the constraints solver needs to efficiently solve constraints whose variables can have large values and bit-widths. The word-level constraints solver described in U.S. Pat. No. 7,512,912 is capable of efficiently solving constraints that include variables that can have large values and bit-widths. However, bit-level SAT and BDD solvers are very inefficient at solving constraints that have variables that can have large values or bit-widths. (Specifically, the internal data structures used by bit-level SAT and BDD constraint solvers can blow up in size when the constraints have variables with large bit-widths. This problem with bit-level SAT and BDD solvers is referred to as "bit-blasting" in the art.) Note that if the constraints problem that is generated from the optimization problem does not involve large values and/or bit-widths, then bit-level SAT and BDD solvers may be efficient. Embodiments described herein can use any type of constraints solvers.

Figure 5B:
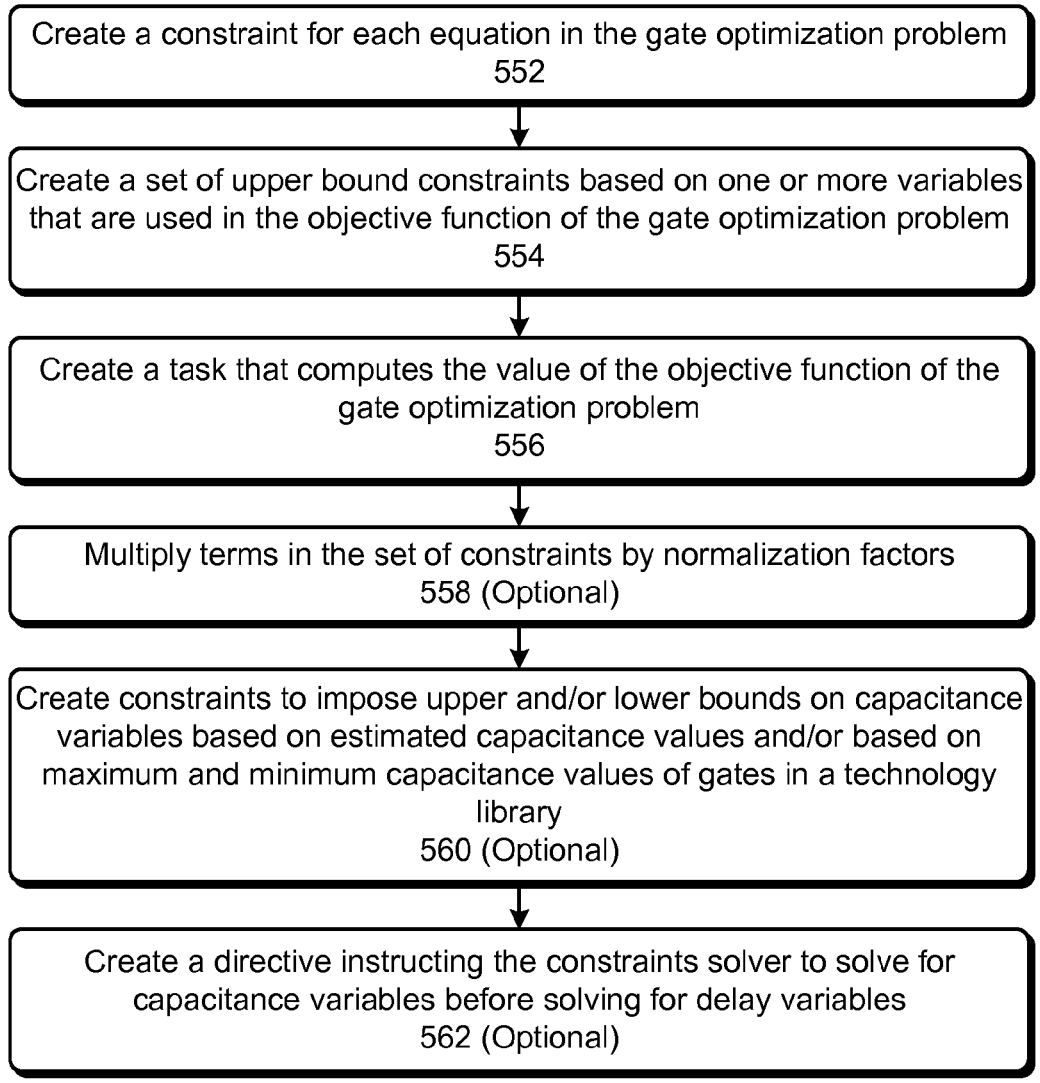
FIG. 5B illustrates a process for creating a constraints problem based on a gate-sizing optimization problem in accordance with some embodiments described herein.

FIG. 5B illustrates a process for creating a constraints problem based on a gate-sizing optimization problem in accordance with some embodiments described herein. The process begins by creating a constraint for each equation in the gate-sizing optimization problem (operation 552). For example, a constraint can be created for each delay equation, e.g., Equations (7), (9), and (11). Next, a set of upper bound constraints can be created based on one or more variables that are used in the objective function of the gate-sizing optimization problem (operation 554). For example, the upper bound constraints "$f_1 \leq cost$," "$f_2 \leq cost$," and "$f_3 \leq cost$" can be created if the objection function shown in Equation (13) is being used. On the other hand, if the objective function shown in Equation (14) is being used, then the upper bound constraints "$f_1 - D1 \leq cost$," "$f_2 - D2 \leq cost$," and "$f_3 - D3 \leq cost$" can be created. A task that computes the value of the objective function of the optimization problem can be created (operation 556). The following operations (operations 558 and 560) are optional. If conversion between floating point numbers and integers is needed, terms in the set of constraints can be multiplied by normalization factors (operation 558). Constraints can be created to impose upper and/or lower bounds on capacitance variables based on estimated capacitance values and/or based on maximum and minimum capacitance values of gates in a technology library (operation 560). A directive can be created that instructs the constraints solver to solve for capacitance variables before solving for delay variables (operation 562).

Next, the embodiment can solve the gate-sizing optimization problem by repeatedly solving the constraints problem using a constraints solver (operation 512). Specifically, the process illustrated in FIG. 1 can be used during operation 510. Once the selected portion of the circuit design has been optimized, the embodiment can check if all gates have been processed (operation 514). If more gates need to be processed ("No" branch), then the embodiment can select the next portion of the circuit design for optimization (operation 516) and return to operation 408.

On the other hand, if all gates have been processed ("Yes" branch), then the embodiment can check if more iterations are required (operation 518). If no more iterations are required ("No" branch, e.g., because the gate sizes have converged to a substantially optimal value or some other termination condition has been met), then the embodiment can output the optimized circuit design (operation 520) that includes gates with the optimized gate sizes. On the other hand, if more iterations are required ("Yes" branch), the embodiment can return to operation 504 and begin processing gates in the circuit design in accordance with the given processing order (with the new gate sizes that were determined in the previous iteration).

Computer System

Figure 6:
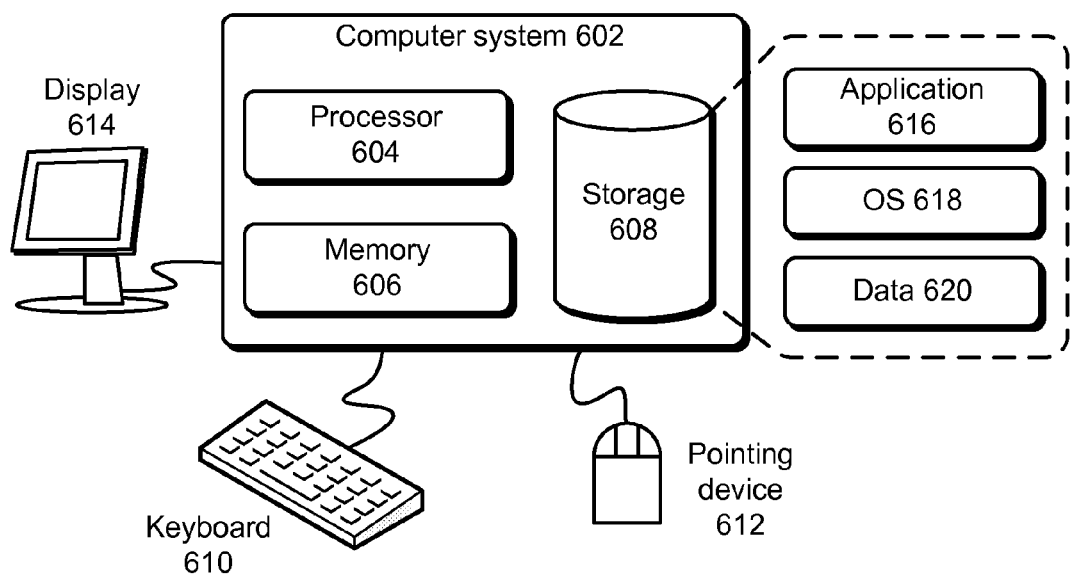
FIG. 6 illustrates a computer system in accordance with an embodiment of the present invention.

FIG. 6 illustrates a computer system in accordance with an embodiment of the present invention. A computer system can generally be any system that can perform computations. Specifically, a computer system can be a microprocessor, an application specific integrated circuit, a distributed computing system, a cloud computing system, or any other computing system now known or later developed. Computer system 602 comprises processor 604, memory 606, and storage 608. Computer system 602 can be coupled with display 614, keyboard 610, and pointing device 612. Storage 608 can generally be any device that can store data. Specifically, a storage device can be a magnetic, an optical, or a magneto-optical storage device, or it can be based on flash memory and/or battery-backed up memory. Storage 608 can store application 616, operating system 618, and data 620.

Application 616 can include instructions that when executed by computer 602 cause computer 602 to perform one or more processes that are implicitly or explicitly described in this disclosure. Data 620 can include any data that is inputted into or outputted by application 616.

Example Constraints

The following is an example of a set of constraints that were generated for a gate-sizing optimization problem. This set of constraints are being presented for illustration purposes only and are not intended to limit the scope of the embodiments disclosed herein.

```
class foo {
    bit[37:0] A__0__0 = 38'd454;      // Constant * 100.0
    bit[37:0] A__0__1 = 38'd452;
    bit[37:0] A__0__2 = 38'd452;
    bit[37:0] A__0__3 = 38'd452;
    bit[37:0] A__0__4 = 38'd452;
    bit[37:0] A__1__0 = 38'd452;
    bit[37:0] A__1__1 = 38'd454;
    bit[37:0] A__1__2 = 38'd452;
    bit[37:0] A__1__3 = 38'd452;
    bit[37:0] A__1__4 = 38'd452;
    bit[37:0] A__2__0 = 38'd454;
    bit[37:0] A__2__1 = 38'd454;
    bit[37:0] A__2__2 = 38'd459;
    bit[37:0] A__2__3 = 38'd454;
    bit[37:0] A__2__4 = 38'd454;
    bit[37:0] A__3__0 = 38'd453;
    bit[37:0] A__3__1 = 38'd453;
    bit[37:0] A__3__2 = 38'd453;
    bit[37:0] A__3__3 = 38'd456;
    bit[37:0] A__3__4 = 38'd453;
    bit[37:0] A__4__0 = 38'd453;
    bit[37:0] A__4__1 = 38'd453;
    bit[37:0] A__4__2 = 38'd453;
    bit[37:0] A__4__3 = 38'd453;
    bit[37:0] A__4__4 = 38'd456;
    bit[78:0] cost;
    bit[78:0] initialCost;
    bit[51:0] E0 = 52'd19;             // fanout__phi * 1000000.0
    bit[45:0] K0 = 46'd336;            // Constant * 10000.0
    bit[37:0] best__C0;
    bit[78:0] best__d0;
    rand bit[37:0] C0;                 // Solution is divided by
```

```
100.0
    rand bit[78:0] d0;
    bit[51:0] E1 = 52'd19;
    bit[45:0] K1 = 46'd336;
    bit[37:0] best_C1;
    bit[78:0] best_d1;
    rand bit[37:0] C1;
    rand bit[78:0] d1;
    bit[51:0] E2 = 52'd15;
    bit[45:0] K2 = 46'd337;
    bit[37:0] best_C2;
    bit[78:0] best_d2;
    rand bit[37:0] C2;
    rand bit[78:0] d2;
    bit[51:0] E3 = 52'd25;
    bit[45:0] K3 = 46'd337;
    bit[37:0] best_C3;
    bit[78:0] best_d3;
    rand bit[37:0] C3;
    rand bit[78:0] d3;
    bit[51:0] E4 = 52'd25;
    bit[45:0] K4 = 46'd337;
    bit[37:0] best_C4;
    bit[78:0] best_d4;
    rand bit[37:0] C4;
    rand bit[78:0] d4;
    constraint c1 {
        A_0_0*C0 + A_0_1*C1 + A_0_2*C2 + A_0_3*C3 +
A_0_4*C4 + E0/C0 + K0 == d0;
        d0 >= 0;
        d0 <= cost;
        C0 <= 516; // Seed Ci's * multiplier * 100.0
        C0 >= 129; // Seed Ci's / multiplier * 100.0
        A_1_0*C0 + A_1_1*C1 + A_1_2*C2 + A_1_3*C3 +
A_1_4*C4 + E1/C1 + K1 == d1;
        d1 >= 0;
        d1 <= cost;
        C1 <= 3452;
        C1 >= 234;
        A_2_0*C0 + A_2_1*C1 + A_2_2*C2 + A_2_3*C3 +
A_2_4*C4 + E2/C2 + K2 == d2;
        d2 >= 0;
        d2 <= cost;
        C2 <= 123;
        C2 >= 45;
        A_3_0*C0 + A_3_1*C1 + A_3_2*C2 + A_3_3*C3 +
A_3_4*C4 + E3/C3 + K3 == d3;
        d3 >= 0;
        d3 <= cost;
        C3 <= 464;
        C3 >= 124;
        A_4_0*C0 + A_4_1*C1 + A_4_2*C2 + A_4_3*C3 +
A_4_4*C4 + E4/C4 + K4 == d4;
        d4 >= 0;
        d4 <= cost;
        C4 <= 345;
        C4 >= 34;
        solve C0, C1, C2, C3, C4 before d0, d1, d2, d3, d4;
    }
    task printFlow( ) {
        printf(" C0: %d, C1: %d, C2: %d, C3: %d, C4: %d\n", C0,
C1, C2, C3, C4);
        printf(" d0: %d, d1: %d, d2: %d, d3: %d, d4: %d\n", d0 ,
d1, d2, d3, d4);
    }
    task printBestFlow( ) {
        printf(" best_C0: %d, best_C1: %d, best_C2: %d,
best_C3: %d, best_C4 : %d\n", best_C0, best_C1, best_C2,
best_C4);
        printf(" best_d0: %d, best_d1: %d, best_d2: %d,
best_d3: %d, best_d4: %d\n", best_d0, best_d1, best_d2,
best_d3, best_d4);
    }
    task saveFlowAsBest( ) {
        best_C0 = C0;
        best_d0 = d0;
        best_C1 = C1;
        best_d1 = d1;
        best_C2 = C2;
        best_d2 = d2;
        best_C3 = C3;
        best_d3 = d3;
        best_C4 = C4;
        best_d4 = d4;
    }
    task computeNewCost( ) {
        cost = d0;
        if (d1 >= cost) {
            cost = d1;
        }
        if (d2 >= cost) {
            cost = d2;
        }
        if (d3 >= cost) {
            cost = d3;
        }
        if (d4 >= cost) {
            cost = d4;
        }
    }
    task saveSolution( ) {
        integer solution_file;
        solution_file = fopen("./race.Solution", "w");
        if (solution_file) {
            fprintf(solution_file, "%d\n", best_C0);
            fprintf(solution_file, "%d\n", best_C1);
            fprintf(solution_file, "%d\n", best_C2);
            fprintf(solution_file, "%d\n", best_C3);
            fprintf(solution_file, "%d\n", best_C4);
        }
        fclose(solution_file);
    }
    task setCost( ) {
        cost = -1;
    }
}
#include "main.vr"
```

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for using a constraints solver to solve a gate optimization problem for a portion of a circuit design, the method comprising:

creating a constraints problem based on the gate-sizing optimization problem for the portion of the circuit design, wherein the constraints problem comprises: (1) a constraint for each equation in the gate-sizing optimization problem, (2) a set of upper bound constraints that impose an upper bound on one or more variables that are used in the objective function of the gate-sizing optimization problem, (3) constraints that impose upper bounds, lower bounds, or both upper bounds and lower bounds on capacitance variables based on one or more of (i) estimated capacitance values, (ii) maximum capacitance values of gates in a technology library, and (iii) minimum capacitance values of gates in the technology library, and (4) a task definition that computes the value of the objective function of the gate-sizing optimization problem; and solving the gate-sizing optimization problem by repeatedly solving the constraints problem using a constraints solver that is executing on a processor, wherein prior to each invocation of the constraints solver the upper bound is increased or decreased based at least on a result returned by a previous invocation of the constraint solver.

2. The method of claim 1, wherein the constraints problem further comprises a directive to solve for capacitance variables before solving for delay variables.

3. The method of claim 1, wherein terms in the set of constraints are multiplied by normalization factors.

4. The method of claim 1, wherein the upper bound is modeled using a state variable in the set of constraints.

5. The method of claim 1, wherein the constraints solver is any solver that is capable of generating one or more solutions for a set of constraints.

6. A non-transitory computer-readable storage medium storing instructions that, when executed by a computer, cause the computer to perform a method for using a constraints solver to solve a gate-sizing optimization problem for a portion of a circuit design, the method comprising:

creating a constraints problem based on the gate-sizing optimization problem for the portion of the circuit design, wherein the constraints problem comprises: (1) a constraint for each equation in the gate-sizing optimization problem, (2) a set of upper bound constraints that impose an upper bound on one or more variables that are used in the objective function of the gate-sizing optimization problem, (3) constraints that impose upper bounds, lower bounds, or both upper bounds and lower bounds on capacitance variables based on one or more of (i) estimated capacitance values, (ii) maximum capacitance values of gates in a technology library, and (iii) minimum capacitance values of gates in the technology library, and (4) a task definition that computes the value of the objective function of the gate-sizing optimization problem; and solving the gate-sizing optimization problem by repeatedly solving the constraints problem using a constraints solver, wherein prior to each invocation of the constraints solver the upper bound is increased or decreased based at least on a result returned by a previous invocation of the constraint solver.

7. The non-transitory computer-readable storage medium of claim 6, wherein the constraints problem further comprises a directive to solve for capacitance variables before solving for delay variables.

8. The non-transitory computer-readable storage medium of claim 6, wherein terms in the set of constraints are multiplied by normalization factors.

9. The non-transitory computer-readable storage medium of claim 6, wherein the upper bound is modeled using a state variable in the set of constraints.

10. The non-transitory computer-readable storage medium of claim 6, wherein the constraints solver is any solver that is capable of generating one or more solutions for a set of constraints.

11. An apparatus, comprising:
a processor; and
a non-transitory computer-readable storage medium storing instructions that, when executed by the processor, cause the apparatus to perform a method for using a constraints solver to solve a gate-sizing optimization problem for a portion of a circuit design, the method comprising:

creating a constraints problem based on the gate-sizing optimization problem for the portion of the circuit design, wherein the constraints problem comprises: (1) a constraint for each equation in the gate-sizing optimization problem, (2) a set of upper bound constraints that impose an upper bound on one or more variables that are used in the objective function of the gate-sizing optimization problem, (3) constraints that impose upper bounds, lower bounds, or both upper bounds and lower bounds on capacitance variables based on one or more of (i) estimated capacitance values, (ii) maximum capacitance values of gates in a technology library, and (iii) minimum capacitance values of gates in the technology library, and (4) a task definition that computes the value of the objective function of the gate-sizing optimization problem; and solving the gate-sizing optimization problem by repeatedly solving the constraints problem using a constraints solver, wherein prior to each invocation of the constraints solver the upper bound is increased or decreased based at least on a result returned by a previous invocation of the constraint solver.

12. The apparatus of claim 11, wherein the constraints problem further comprises a directive to solve for capacitance variables before solving for delay variables.

13. The apparatus of claim 11, wherein terms in the set of constraints are multiplied by normalization factors.

14. The apparatus of claim 11, wherein the upper bound is modeled using a state variable in the set of constraints.

15. The apparatus of claim 11, wherein the constraints solver is any solver that is capable of generating one or more solutions for a set of constraints.

* * * * *